United States Patent [19]

Yanagida

[11] Patent Number: 5,314,575
[45] Date of Patent: May 24, 1994

[54] ETCHING METHOD AND APPARATUS

[75] Inventor: Toshiharu Yanagida, Kanagawa, Japan

[73] Assignee: Sony Corporation, Tokyo, Japan

[21] Appl. No.: 927,954

[22] Filed: Aug. 11, 1992

Related U.S. Application Data

[62] Division of Ser. No. 614,137, Nov. 16, 1990, Pat. No. 5,160,395.

[30] Foreign Application Priority Data

Nov. 17, 1989 [JP] Japan .................. 1-298914

[51] Int. Cl.⁵ .................................. H01L 21/00
[52] U.S. Cl. ............................... 156/651; 156/653; 156/662; 156/643; 156/646
[58] Field of Search ........... 156/643, 646, 662, 650, 156/651, 653

[56] References Cited

U.S. PATENT DOCUMENTS

| | | | |
|---|---|---|---|
| 806,381 | 12/1958 | Thomas et al. | 204/298.34 |
| 3,730,873 | 5/1973 | Pompei et al. | 204/298.34 |
| 4,399,016 | 8/1983 | Tsukada et al. | 118/723 |
| 4,631,248 | 12/1986 | Pasch . | |
| 4,657,619 | 4/1987 | O'Donnell | 204/298.37 |
| 4,764,245 | 8/1988 | Grewal | 156/646 |
| 4,842,707 | 6/1989 | Kinoshita | 204/298.37 |

FOREIGN PATENT DOCUMENTS

| | | |
|---|---|---|
| 0282820 | 9/1988 | European Pat. Off. . |
| 53-68171 | 6/1978 | Japan . |
| 57-44749 | 9/1982 | Japan . |
| 61-089635 | 10/1984 | Japan . |
| 60-11109 | 3/1985 | Japan . |
| 61-190944 | 8/1986 | Japan . |
| 63-81928 | 4/1988 | Japan . |
| 63-192229 | 8/1988 | Japan . |

OTHER PUBLICATIONS

J. Poisson et al., "VIA Contact Dry Etching Using a Plasma LCW Resistance Photoresist", *1986 Proceedings Third International IEEE VLSI Multilevel Interconnection Conference*, Jun. 9–10, 1986, pp. 308–318.

"CF, RIE Pre-Etch During Etchback of Sidewall Formation", *IBM Technical Disclosure Bulletin*, vol. 29, No. 1, Jun. 1986, pp. 110–111.

Stocker, "Selective Reactive Ion Etching of Silicon Nitride on Oxide in a Multifacet ('HEX') Plasma Etching Machine", *Journal of Vacuum Science & Technology*, vol. 7, No. 3, Part I, May/Jun. 1988, pp. 1145–1149.

Smith, *Semiconductor World* by Press Journal, Jan. 1987, pp. 121–127.

*Primary Examiner*—Brian E. Hearn
*Assistant Examiner*—George Goudreau
*Attorney, Agent, or Firm*—Hill, Steadman & Simpson

[57] ABSTRACT

A reactive ion etching method is described in which a silicon compound film formed on an underlying layer or a substrate is etched through a mask layer by a two-stage procedure. In the two-stage procedure, part of the silicon compound film is first etched with a gas containing a hydrogen-free carbon fluoride gas at a high etching rated and then with a gas containing a hydrogen-containing carbon fluoride gas while reducing the damage on the underlying layer or substrate. The apparatus for carrying out the method is also disclosed.

8 Claims, 5 Drawing Sheets

ETCHING METHOD AND APPARATUS

CROSS-REFERENCE TO RELATED APPLICATIONS

This is a division of application Ser. No. 07/614,137 filed Nov. 16, 1990, which issued as U.S. Pat. No. 5,160,398 on Nov. 3, 1992.

BACKGROUND OF THE INVENTION

1. Field of the Invention

This invention relates to an etching method and apparatus which is utilizable for etching in the manufacture of electronic devices such as semiconductor devices.

2. Description Of The Prior Art

Etching techniques have been employed in various fields, in which there is a demand for higher etching rates in order to improve productivity.

For instance, in the field of electronic materials or the production of semiconductor devices, there is a strong demand for increasing the etching rate with an increasing size or diameter of a semiconductor wafer and an increasing degree of fineness of the pattern. For in-plane uniform etching of a fine pattern in a large-sized wafer, conventional batch systems wherein a number of wafers are treated at one time are not appropriate. An etching process wherein wafers are treated one by one is desirable. However, the treating time in the one-by-one process is only for one wafer with a longer time being required than in the batch system. Accordingly, it is necessary to increase the etching rate so as to increase a treating efficiency.

Some one-by-one etching techniques have been put into practice but cannot be applied to all materials to be treated. For instance, an etching rate for $SiO_2$ is not so high as to obtain the same throughput as in known batch systems.

For high speed etching, problems involved by the high speed of etching have to be solved.

One of the problems is a damage-preventing problem and another is a problem on uniformity of the treatment.

As for the damage prevention, the etching rate may be increased by using a great etching energy or a highly reactive gas. However, such use has a fear of giving damages on an underlying layer. Although the requirements for high speed etching and reduction of the damage are contrary to each other, both requirements have to be satisfied for realizing the high etching rate.

With respect to the uniformity of the treatment, it may be sacrificed if the energy is increased. For example, if the uniformity is impeded under high rate conditions by adoption of the one-by-one treatment, it will be meaningless to use such a treatment. In Japanese Patent No. 60-11109, there is described a magnetron dry etching method using a high rate treatment with reduced damages. However, there is left a problem on the uniformity. On the other hand, Japanese Patent Publication No. 57-44749 discloses an etching technique wherein uniform treatments are possible with reduced damages. However, a further improvement is desirable with respect to the high speed etching.

Thus, there is a demand for etching techniques which ensure high speed etching and can solve the problems which will be ordinarily involved in the high speed etching, e.g. problems on the damages and the uniformity as discussed above.

SUMMARY OF THE INVENTION

It is accordingly an object of the invention to provide an etching method wherein etching is performed at high rate with a reduced degree of damages on an underlying layer or layers.

It is another object of the invention to provide an etching apparatus which is suitable for etching at a high rate with good uniformity of the etching treatment.

It is a further object of the invention to provide an etching apparatus which is suitable for etching at a high rate with a reduced degree of damages of underlying layers.

According to one embodiment of the invention, there is provided a reactive ion etching method which comprises the steps of:

forming a mask layer on a silicon compound film in a pattern;

etching part of the silicon compound film along a depth of the film through the mask layer by means of a gas containing a hydrogen-free carbon fluoride gas; and further etching the remaining portion of the silicon compound film along the depth with a gas containing a hydrogen-containing carbon fluoride gas.

According to another embodiment of the invention, there is provided a cathode-coupling parallel plate-type magnetron reactive ion etching (RIE) apparatus for carrying out the etching method, the apparatus comprising:

an anode electrode;

a cathode electrode spaced in parallel to the anode electrode to form a discharge region therebetween and supporting a material to be etched thereon;

a magnet means which is provided behind the anode electrode and which has a magnetic field component intersecting with an electric field and is movable along a direction intersecting at right angles with the electric field; and a plurality of magnets provided equally around the cathode electrode and having a magnetic field component intersecting with the electric field.

Preferably, a further electrode having a fluorine-containing resin is provided in the apparatus in the discharge region.

PREFERRED EMBODIMENTS OF THE INVENTION

Figure 1A:
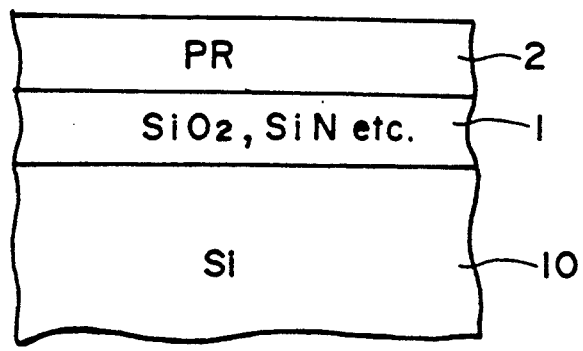
FIGS. 1A–1D are, respectively, schematic sectional views showing an etching method used in Example 1.

According to the method of the invention, a silicon compound film formed on a suitable support can be etched to a desired depth at a high rate by etching it with a gas mainly composed of a hydrogen-free carbon fluoride. The portion of the silicon compound film remaining along the depth of the film is then etched with a gas mainly composed of a hydrogen-containing carbon fluoride gas, so that the etching can be performed without damaging an underlying layer or layers.

More particularly, the etching of the film to a given depth can be effected at a high rate. At a stage where the film thickness is small or an underlying layer may be influenced by the etching, a gas giving a less damage on the underlying layer is used for further etching. By the two-stage etching procedure, high rate and low damage etching becomes possible according to the invention.

In the practice of the invention, the gases used in the respective etching procedures may comprise, aside from the main gases, other gases such as inert gases. The term "main gas" used herein is intended to mean that the gas is contained in an etching gas system in such an amount that a desired level of etching can be achieved.

The hydrogen-free carbon fluoride gas used in the present invention includes fluorine-containing gases called Flon or Freon gases, of which no hydrogen atom is contained in the molecule. Examples of the carbon fluoride include those gases of the formulas, $C_nF_{2n+2}$ and $C_nF_{2n}$ wherein n is an integer of not less than 1. Preferred examples include $C_3F_8$, $C_2F_6$, $C_4F_8$ and the like.

On the other hand, the hydrogen-containing carbon fluoride gases are fluorine-containing gases in which hydrogen atom or atoms are contained. Examples of such gases include those of the formula, $C_nH_{2n+2-m}F_m$, wherein n and m are, respectively, an integer of not less than 1. Specific and preferred examples include $CHF_3$, $CH_2F_2$ and the like.

The silicon compound film to be etched in the method of the invention is a film made of various silicon compounds such as oxides, nitrides and the like of silicon and is not critical provided that it can be etched. $SiO_2$, silicon nitrides such as $Si_3N_4$ and the like will be effectively etched especially when the underlying layer is a silicon substrate which may be greatly damaged by etching.

The apparatus for carrying out the method of the invention has been defined hereinbefore, which is characterized in that one group of magnets are provided behind an anode electrode so that they are movable along a direction intersecting with an electric field and have a magnetic field component intersecting with the electric field and that another group of magnets having a magnetic field component intersecting with the electric field are provided around a cathode electrode at equal intervals.

In the apparatus of the invention, when one group of magnets having the magnetic field component intersecting with the electric field are moved along a direction intersecting at right angles with an electric field behind or at a back side of the anode electrode, a magnetic field in a main discharge region formed between the anode and cathode electrodes is established. In addition, the magnets provided equally around the cathode electrode ensures a uniform magnetic field in the main discharge region, resulting in uniform etching.

The "behind or at the back side of" the anode electrode is intended to mean a side opposite to the main discharge region where the etching reaction proceeds predominantly. The term "provided equally" used herein means not only "provided at equal intervals", but also "provided to give a uniform magnetic field", resulting in uniform etching. Moreover, the term "intersecting" means not only "intersecting at right angles", but also intersecting at angles sufficient to show the effect of the magnetic field.

It is preferred that in the main discharge region established between the anode and cathode electrodes of the etching apparatus, a third electrode having a fluorine-containing resin is provided.

In this arrangement, a fluorine-based etchant is produced from the fluorine-containing resin of the third electrode, by which etching in the main discharge region is facilitated with an increasing etching rate. In general, fluorine-based ions are supplied by sputtering and function as an etchant.

The electrode used to introduce the etchant is formed as a third electrode and can be controlled separately from the cathode with respect to its supply power. This makes it possible to independently control an energy for the formation of the etchant and an energy for ions implanted into materials to be etched, e.g. semiconductive wafers. This is effective in achieving low damage and high rate etching.

The third electrode may be provided with the fluorine-containing resin in a manner sufficient to supply the etchant. Thus, it is not necessarily required to cover the electrode with the resin although such covering is preferred.

The fluorine-containing resin is preferably so-called Teflon or polyethylene tetrafluoride. As a matter of course, other fluorine-containing resins capable of releasing a fluorine-containing etchant may be likewise used.

The present invention is more particularly described by way of examples wherein reference is made to the accompanying drawings.

EXAMPLE 1

In this example, the method of the invention is particularly described, which is especially suitable for fabrication of highly integrated semiconductor devices.

In this example, etching of a $SiO_2$ film is described. The etching of $SiO_2$ is considered to proceed based on a so-called ion-assisted reaction where ions are chiefly contributed to etching. However, when a material to be etched, such as a silicon wafer, is exposed to a high density plasma using a highly dissociating gas capable of producing ions such as $CF_3^+$ ions having the capability of etching $SiO_2$, the damage of a substrate with the incident ions is not negligible. If an acceleration voltage of the incident ions is suppressed to an extent by discharge from a magnetron, application of high RF power for high speed etching apparently results in an increase of damages accompanied by an increasing ion current density. The suppression of such damages is possible only with a sacrifice of the etching rate. This is completely overcome by the method of the invention wherein a $SiO_2$ film can be etched at a high rate while suppressing damages of a substrate.

In the method of the invention, a $SiO_2$ film formed on an underlying layer or a substrate is subjected first to high speed anisotropic etching with a gas mainly composed of a H-free flon gas, e.g. $C_3F_8$ or $C_2F_6$, just before the underlying layer is exposed. Subsequently, an etching gas mainly composed of a fluorine-containing gas containing at least one hydrogen atom in the molecule, e.g. $CHF_3$, is used instead, so that incident ion damages on the underlying layer can be suppressed.

The etching method using a cathode-coupling, parallel plate-type magnetron RIE apparatus is particularly described.

In this example, as shown in FIG. 1A, a silicon substrate 10 was provided, on which a film 1 of a silicon compound such as $SiO_2$ or SiN was formed. On the $SiO_2$ film 1 was further formed a resist layer 2 for mask formation, followed by patterning to form a patterned mask layer 21 as shown in FIG. 1B.

Figure 1B:
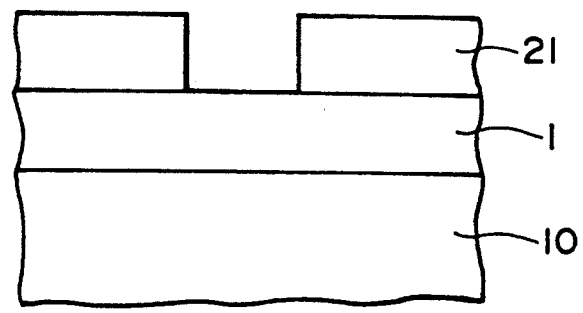
Figure 1C:
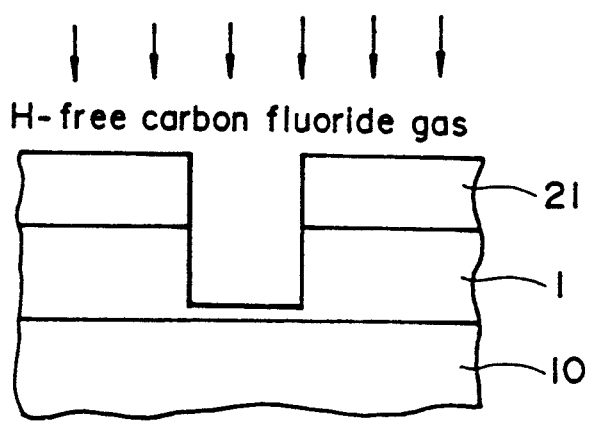

The silicon compound film 1 was etched through the patterned mask layer 21 of FIG. 1B. Using the cathode-coupling parallel plate-type magnetron RIE apparatus, the pattern etching was effected by two stages under the following conditions.

I. Pattern etching step under high rate conditions
Gas used and its flow rate: $C_3F_8$, 46 SCCM
Pressure of atmosphere: 2 Pa
RF power: 2.76 $W/cm^2$
Applied magnetic field: 100 Gausses The above high speed or rate etching under the above conditions was continued for a time corresponding to approximately 10% of the film thickness left. Sofar as the underlying substrate was not exposed, the high speed etching should preferably be continued over the full etching time. More particularly, the etching should be continued to a time corresponding to not larger than 10%, preferably not larger than 5% of the film left along the depth thereof. In this connection, it will be noted that the thickness of the silicon compound film 1 is believed to be usually scattered at approximately 3% and the scattering has to be taken into account for the high speed etching in order not to cause the underlying layer to be exposed.

The high speed etching has a rate as high as about three times that of a subsequent low damage etching using the following conditions.

II. Pattern etching step using the following low damage etching conditions.
Gas used and its flow rate: $CHF_3$, 50 SCCM
Pressure of atmosphere: 2 Pa
RF power: 1.33 $W/cm^2$
Applied magnetic field: 100 Gausses The etching should preferably be changed from the high speed etching conditions to the low damage etching conditions at the time when the film on the underlying layer is as thin as possible provided that the underlying layer is not exposed. More particularly, a time at which an appropriate remaining thickness of the film being etching is reached should be checked and set. The etching is continued for the time checked. Alternatively, the time at which the etching conditions are changed may be determined by monitoring through visual or other observation.

Figure 1D:
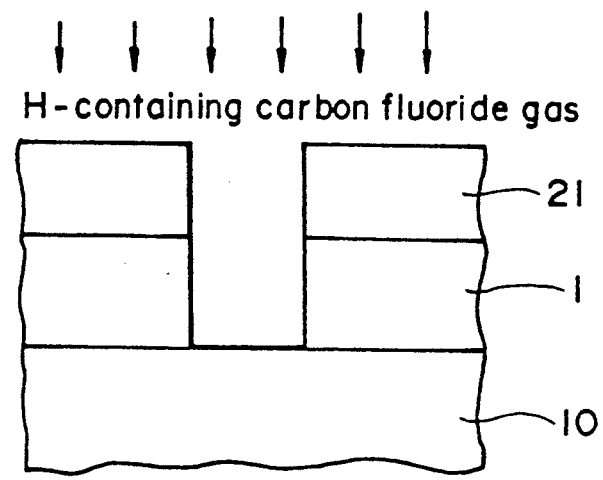

As a result of the etching under the different conditions, a fully etched structure as shown in FIG. 1D is obtained.

In this example, an etching rate of not lower than 900 nm/minute could be attained by carrying out the two-stage pattern etching under the conditions of I and II. In addition, the $SiO_2$ film could be etched while suppressing the damage on the substrate. In conventional batch-wise etching methods, the etching rate was found to be as low as 40 to 50 nm/minute. According to the procedure of Example 1 of the invention, the production efficiency comparable to that of the known batchwise method could be achieved even when wafers were etched one by one.

The reduction of the damage on the substrate will be apparent from the following experiment.

Two gases of $CHF_3$ and $C_3F_8$ used in the above example were, respectively, used for etching under conditions of RF power of 1.33 $W/cm^2$ in the same manner as in the above example and damages on the substrate were evaluated by a thermal wave method. As a result, it was found that the damage evaluation was reduced from 465 units for the $C_3F_8$ gas to 110 units for the $CHF_3$ gas. It will be noted that the value is about 25 units for no damage. Thus, the damage reduction was 76%.

The above results reveal that the method of the invention wherein a hydrogen-containing carbon fluoride gas is used for pattern etching at the time of exposing the substrate is significantly effective in reducing the substrate damages.

For the etching with a hydrogen-containing carbon fluoride gas used in the latter step, activated fluorine is caught with hydrogen, so that the selection ratio between $SiO_2$ and Si can be controlled.

The damage evaluation of the substrate by the thermal wave method was made in the following manner. While an energy was periodically given to an object to be measured by means of an Ar ion laser beam modulated at 1 MHz, a HeNe laser beam with a beam intensity of approximately 3 MW was focussed on the object and a light component only reflected from the object was polarized and separated for detection. The above operation was performed prior to and after the etching to determine a variation in reflectance or a variation in periodic condition as absorption units of the thermal wave. This evaluation method is described in detail in "Monthly Semiconductor World" by The Press Journal, January, 1987, p. 121–127.

As described above, according to the method of the invention, a silicon compound film such as $SiO_2$ film or SiN film is dry etched in a pattern by a two-stage procedure wherein high speed anisotropic etching is first effected using a gas mainly composed of a H-free carbon fluoride gas such as $C_3F_8$, $C_2F_6$ or the like immediately before the underlying layer is exposed and low damage etching is then effected using a gas mainly composed of a carbon fluoride gas containing at least one hydrogen atom in the molecule, e.g. $CHF_3$. Thus, the high rate and low damage etching of the silicon compound film such as a $SiO_2$ film can be achieved. Accordingly, one-by-one etching of wafers may be possible. The low damage etching will lead to an improvement of device characteristics along with a reduction in the surface treatment after etching.

EXAMPLE 2

An etching apparatus as shown in FIG. 2 is described in this example.

As stated before, in order to satisfy the requirement for the high speed etching, a microwave plasma etcher utilizing ECR discharge or a RIE apparatus utilizing magnetron discharge has been developed as a means for forming a high density plasma. With the RIE apparatus of the magnetron discharge type, there are involved problems in optimization of an applied intensity of magnetic field and in-plane uniformity of materials to be treated, e.g. a wafer. To cope with the problems, those apparatus using an AC magnetic field or mechanical scanning of permanent magnets have been proposed. They have merits and demerits, respectively, and any technique of satisfying all the requirements for high speed etching, good uniformity and a low damage on underlying layers has not been developed yet.

Figure 2A:
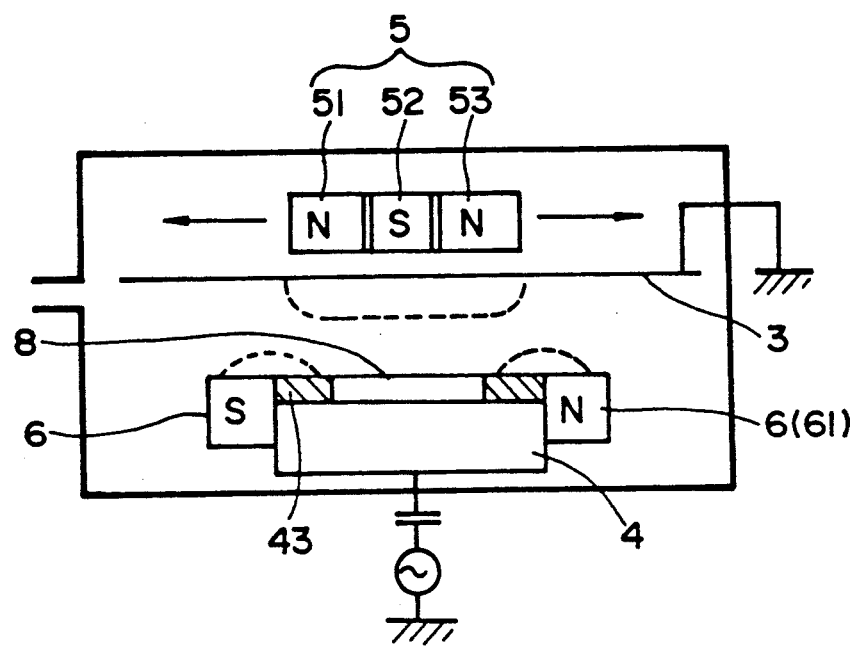
FIGS. 2A–2B are, respectively, schematic views of an etching apparatus according to one embodiment of the invention as used in Example 2.
Figure 2B:
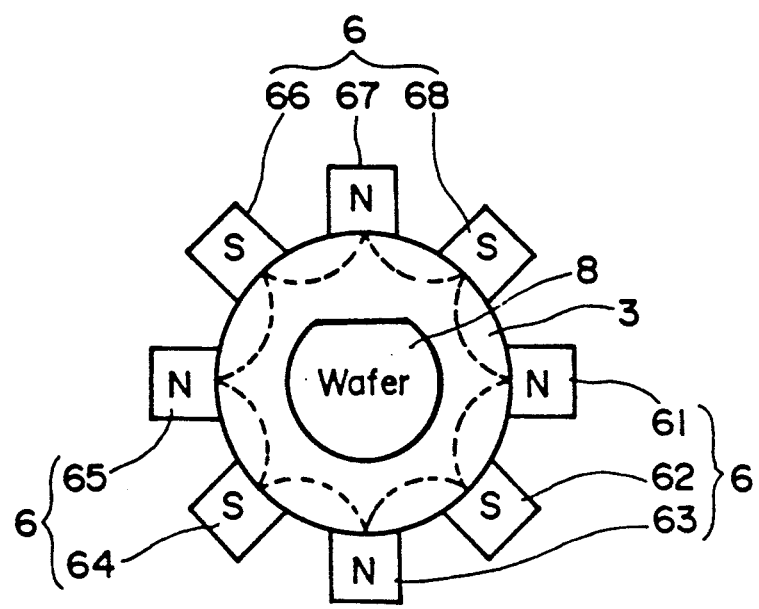

Reference is now made to FIGS. 2A-2B wherein a RIE apparatus which can meet all the requirements is shown.

FIG. 2A shows a cathode-coupling magnetron discharge-type RIE apparatus which includes an anode electrode 3 and magnets 51 to 53 provided behind the anode 3. The magnets 51 to 53 are so arranged as to be scanned. The apparatus has a cathode electrode 4 in face-to-face relation with the anode 3. Magnets 61 to 68 are provided at equal intervals around the cathode electrode 4 as shown in FIG. 2B to give a magnetic field applicator means. The magnets 51 to 53 provided at the back side of the anode electrode 3 have a magnetic field component intersecting at right angles with an electric field and are movable along directions intersecting at right angles with the electric field as shown, for example, by opposite arrows in FIG. 2A. The magnets 61 to 68 provided around the cathode electrode 4 have a magnetic field component intersecting at right angles with the electric field. In FIGS. 2A and 2B, broken lines indicate lines of magnetic forces.

In this embodiment, the uniform magnetic field applicator means consisting of the magnets 61 to 68 can prevent a lowering of the etching rate around a material 8 to be etched, which will not be compensated with the mechanical scanning of the magnets 51 to 53. In FIG. 2A, the magnets 51 to 53 provided at the back side of the anode electrode 3 have such an arrangement that scanning is made as desired. The magnets 51 to 53 may be provided within an etching chamber as shown in FIG. 2A or outside the chamber.

In etching of $SiO_2$, an etching rate is facilitated by utilizing sputtering of a cathode material. For instance, as shown in FIG. 2A, a cathode cover 43 may be provided. The cover 43 is constituted of a fluorine-containing resin such as Teflon. By this, ion species are efficiently produced around the material 8 to be etched (e.g. a semiconductor wafer) which contributes to sputtering, thus improving the etching rate. The embodiment shown in FIG. 2A is one example of an arrangement for improving the etching rate by sputtering of such a cathode material and is not described for limitation.

According to this embodiment, in addition to a magnetic field applied to the main discharge region between the anode and cathode electrodes, an auxiliary magnetic field applicator means is provided around the material 8 to be etched, thereby ensuring an improved etching rate or speed and an improved in-plane uniformity of the material 8 to be etched. Thus, the uniformity of the etching can be improved by the use of the high speed magnetron RIE etching apparatus.

Using the above apparatus, high speed etching conditions I as set forth in Example 1 may be used singly or in combination with the conditions II for high speed etching. Alternatively, the high speed etching of silicon materials may be performed without use of such carbon fluoride gases free of any hydrogen atoms.

EXAMPLE 3

A further embodiment of an etching apparatus of the invention is described in this embodiment, wherein a third electrode is used.

Figure 3:
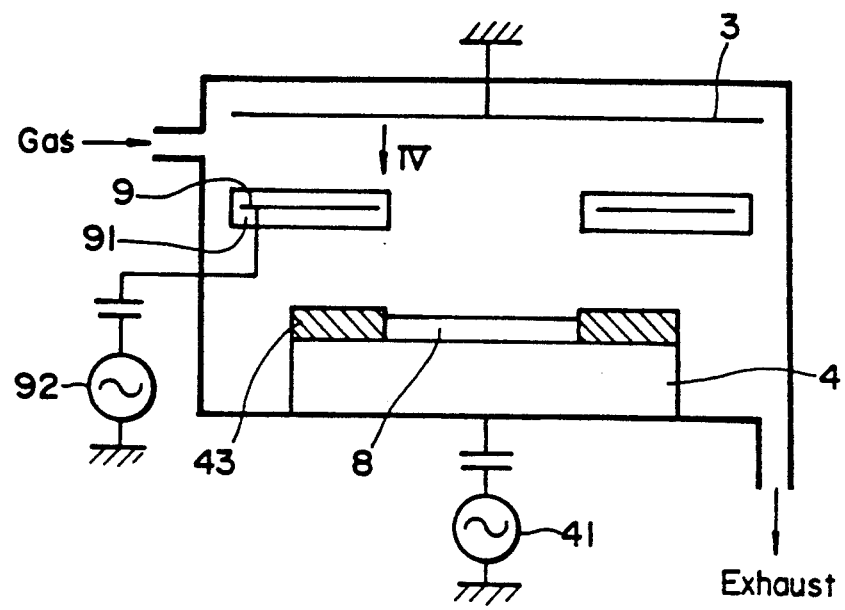
FIG. 3 is a schematic view of an etching apparatus according to another embodiment of the invention as used in Example 3.

In Example 2, the coverage of the cathode electrode with a fluorine-containing resin has been described in order to improve the etching rate of $SiO_2$ in the RIE apparatus. By this, $CF_x^+$ and the like are produced as an etchant by sputtering with incident ions. In order to further increase the etching rate, a further embodiment is described. FIG. 3 shows such an embodiment.

In FIG. 3, there is shown a cathode-coupling type RIE apparatus similar to one shown in FIG. 2. In FIG. 3, like reference numerals as in FIG. 2 indicate like parts or members. In a main discharge region established between the anode electrode 3 and the cathode electrode 4, a third electrode 9 having a fluorine-containing resin cover 91 is provided as shown in the figure. The third electrode 9 is applied with high frequency power from a high frequency power supply 92. A high frequency power supply for the cathode electrode 4 is indicated by 41.

Application of high frequency power to the third electrode 9 results in an increasing amount of an etchant from the fluorine-containing resin cover 91 by sputtering.

Figure 4:
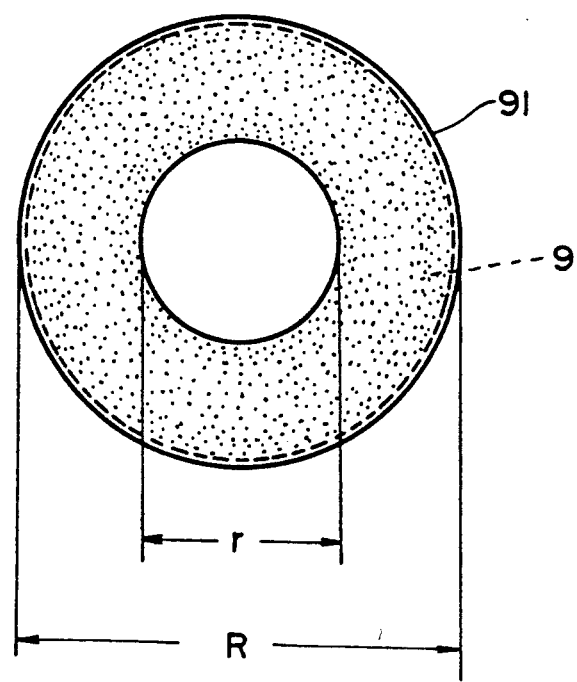
FIG. 4 is a plan view of a electrode of the apparatus of FIG. 3, taken from a direction of the arrow IV in FIG. 3.

The third electrode 9 has a ring structure as shown in FIG. 4 which is viewed from the direction IV in FIG. 3. An outer diameter, R, should be larger than the diameter of the cathode electrode 4. The ring structure has an opening at the center thereof with a diameter, r, which is substantially equal to a diameter of the material to be etched. In doing so, the main discharge is not impeded.

In this embodiment, a cathode cover 43 may be provided and made of a teflon resin. The cathode cover 43 has an opening in which the material to be etched is snugly accommodated.

The feed of a $CF_x^+$ etchant is increased by sputtering of the cathode cover 43 and from the surface of the third electrode 9. This results in a high etching rate of $SiO_2$. If a rare gas such as Ar is added to the etching gas, the sputtering can be effectively carried out by discharge of the gas. In this condition, the etching may be effected without use of any hydrogen-free gas.

In the apparatus of this embodiment, the power applications to the third electrode 9 and the cathode 4 can be separately controlled, so that it becomes possible to separately control formation of the etchant and the incident ion energy to the material 8 to be etched. Accordingly, the material 8 to be etched can be etched at a high rate with a reduced damage of the underlying layer.

More particularly, the power supply 41 for the cathode electrode 4 is able to generate a high frequency, for example, of 100 KHz to 13.56 MHz. The high frequency with such a relatively low frequency is given to the cathode electrode 4, permitting the ions to be readily followed. As a consequence, the intensity of the electric field of an ion sheath formed on the material 8 to be etched is reduced. On the other hand, the power supply 92 for the third electrode 9 generates a high frequency, for example, of 13.56 MHz. In this manner, the frequencies and applied power intensities can be independently controlled.

In this example, $SiO_2$ was used as the material 8 to be etched and etched by the used of the apparatus illustrated above under the following etching conditions.

Gas used: $C_2F_6$ or $C_3F_8$
Flow rate: 46 SCCM
Gas pressure: 0.5 to 2 Pa
Application power: 2.76 W/cm$^2$ The reason why a carbon fluoride gas of the formula, $C_nF_{2n+2}$ was used as an etching gas was to achieve the high speed etching.

Under the conditions set forth above, efficient etching of SiO$_2$ could be achieved with the damage of the substrate being suppressed.

In this embodiment, the third electrode 9 covered with a fluorine-containing resin 91 is provided in the discharge region and applied with high frequency electric power, so that an etchant is increased in amount by sputtering. Thus, high speed etching of SiO$_2$ becomes possible. The high speed etching leads to an improved throughput sufficient for practical application even when wafers are etched one by one.

In the above example illustrated, the carbon fluoride gas free of any hydrogen atom in the molecule was used as an etching gas, but an inert gas such as argon alone may be used for the etching since fluorine is supplied from the fluorine-containing resin 91. Thus, the use of the apparatus as shown in FIGS. 3 and 4 ensures etching of silicon compounds such as SiO$_2$ without use of any carbon fluoride gas free of any hydrogen.

In the apparatus of this embodiment, formation of an etchant and an incident ion energy to the material 8 to be etched can be independently controlled, making it possible to attain both high speed etching and a reduced damage on underlying layer.

EXAMPLE 4

In this embodiment, the third electrode 9 is applied to a magnetron RIE apparatus and particularly, to a cathode-coupling magnetron RIE apparatus.

Figure 5:
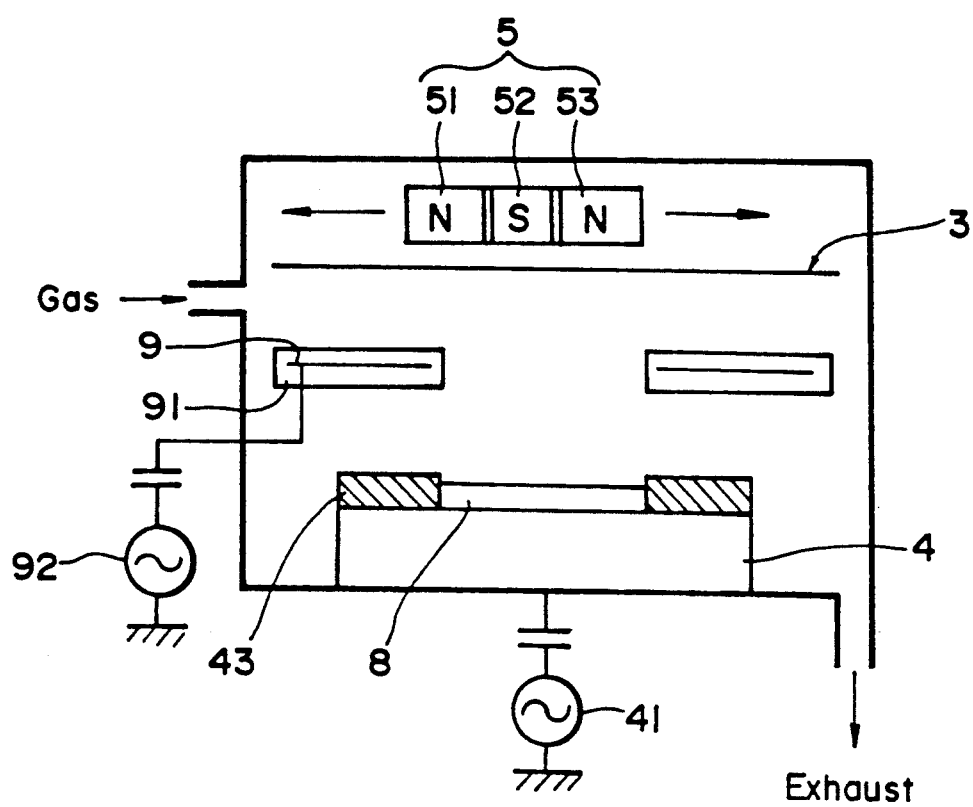
FIGS. 5 and 6 are, respectively, schematic views of etching apparatus according to further embodiments of the invention as used in Examples 4 and 5.

The etching apparatus of this embodiment is shown in FIG. 5 wherein magnets 51 to 53 are provided behind the anode electrode 3 so that a magnetic field is formed as intersecting at right angles with an electric field. By this, magnetron etching is performed.

Like reference numerals as in FIG. 4 indicate like members in FIG. 5.

When etching was effected under the same conditions as in Example 3, high speed etching of SiO$_2$ as in Example 3 could be achieved. The in-plane uniformity inherent to the magnetron RIE technique could be shown.

EXAMPLE 5

In this embodiment, a magnetic field generating means is uniformly provided around the cathode electrode 5 as shown in FIG. 2 and the third electrode 9 having the fluorine-containing resin 91 is provided. More particularly, the arrangements of FIGS. 2 and 3 are combined together.

Figure 6:
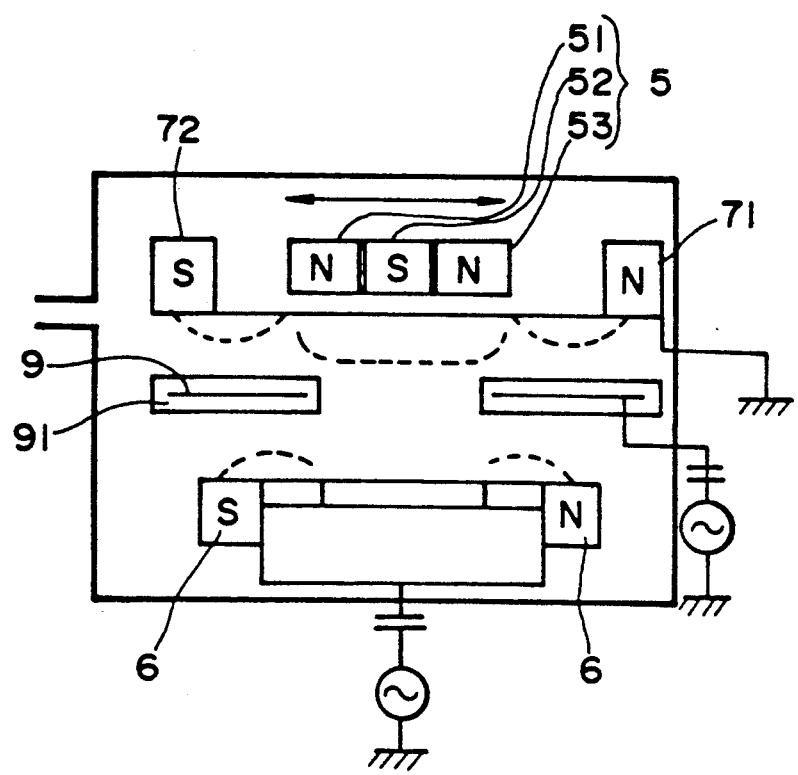

This embodiment is shown in FIG. 6. As will be apparent from the figure, auxiliary magnet means 51 to 53 as in FIG. 2 is provided and the third electrode 9 covered with the fluorine-containing resin 91 such as teflon is placed in the discharge region. The magnet means may further include magnets 71 and 72 in order to generate magnetic fields in connection with the third electrode 9 as shown in the figure. By the use of the third electrode 9, an etchant is increased in amount as stated before, with an increasing etching rate of SiO$_2$. Small electric power for the etching was sufficient. For instance, a magnet of 100 gausses was used and a desired degree of etching could be achieved at 1.33 W/cm$^2$. In the arrangement of this embodiment, use of only a rare gas such as argon was sufficient for etching of a SiO$_2$ film without use of any fluorine-containing gas such as a flon gas.

What is claimed is:

1. A reactive ion etching method which comprises the steps of:
   forming a mask layer with a pattern on a silicon compound film;
   etching part of the silicon compound film along a depth of the film through the mask layer with a first etching gas consisting of a hydrogen-free carbon fluoride gas; and
   further etching the remaining portion of the silicon compound film along the depth with a second etching gas consisting of a hydrogen-containing carbon fluoride gas.

2. The method according to claim 1, wherein the silicon compound film is made of a member selected from the group consisting of silicon oxides and silicon nitrides and is formed on a support.

3. The method according to claim 1, wherein the hydrogen-free carbon fluoride gas is of the formula, $C_nF_{2n}$ or $C_nF_{2n+2}$ wherein n is an integer of not less than 1.

4. The method according to claim 1, wherein the hydrogen-containing carbon fluoride gas is of the formula, $C_nH_{2n+2-m}F_m$ wherein n and m are each an integer of not less than 1.

5. A reactive ion etching method which comprises the steps of:
   forming a mask layer with a pattern on a silicon compound film;
   etching part of the silicon compound film along a depth of the film through the mask layer with a first etching gas containing a hydrogen-free carbon fluoride gas, stopping the etching when less than 10 percent of the depth of the film is left; and
   further etching the remaining portion of the silicon compound film along the depth with a second etching gas containing a hydrogen-containing carbon fluoride gas.

6. A method according to claim 1, wherein the hydrogen-free carbon fluoride gas is selected from the group consisting of $C_3F_8$, $C_2F_6$ and $C_4F_8$.

7. A method according to claim 6, wherein the hydrogen-containing carbon fluoride gas is selected from the group consisting of $CHF_3$ and $CH_2F_2$.

8. A method according to claim 1, wherein the hydrogen-containing fluoride gas of the second etching gas is selected from the group consisting of $CHF_3$ and $CH_2F_2$.

* * * * *